(12) United States Patent
Grieger

(10) Patent No.: US 12,013,424 B2
(45) Date of Patent: Jun. 18, 2024

(54) ANTENNA TEST SYSTEM AND A METHOD FOR TESTING AN ANTENNA

(71) Applicant: XILINX, INC., San Jose, CA (US)

(72) Inventor: Michael Grieger, Dresden (DE)

(73) Assignee: XILINX, INC., San Jose, CA (US)

( * ) Notice: Subject to any disclaimer, the term of this patent is extended or adjusted under 35 U.S.C. 154(b) by 477 days.

(21) Appl. No.: 17/252,687

(22) PCT Filed: Jun. 12, 2019

(86) PCT No.: PCT/EP2019/065299
§ 371 (c)(1),
(2) Date: Dec. 15, 2020

(87) PCT Pub. No.: WO2019/243124
PCT Pub. Date: Dec. 26, 2019

(65) Prior Publication Data
US 2021/0116489 A1   Apr. 22, 2021

(30) Foreign Application Priority Data

Jun. 18, 2018 (EP) ..................................... 18178174

(51) Int. Cl.
*G01R 29/08* (2006.01)
*G01R 29/10* (2006.01)
(Continued)

(52) U.S. Cl.
CPC ......... *G01R 29/0892* (2013.01); *G01R 29/10* (2013.01)

(58) Field of Classification Search
CPC ........ H04B 17/12; H04B 17/29; H04B 17/18; H04B 17/0085; G01R 29/10; G01R 29/0892
See application file for complete search history.

(56) References Cited

U.S. PATENT DOCUMENTS

2011/0200084 A1* 8/2011 Griesing ................ H01Q 3/267
375/224
2011/0270567 A1* 11/2011 Mow .................. H04B 17/0087
702/120

(Continued)

OTHER PUBLICATIONS

International Search Report and Written Opinion for PCT/EP2019/065299 dated Sep. 17, 2019.

*Primary Examiner* — Jermele M Hollington
*Assistant Examiner* — Suresh K Rajaputra
(74) *Attorney, Agent, or Firm* — Patterson + Sheridan, LLP

(57) ABSTRACT

An antenna test system for testing an antenna with a plurality of antenna elements is disclosed. The antenna test system includes an antenna element connector for every antenna element of the antenna, wherein the antenna element connectors are wiredly couplable to the respective antenna elements, a channel emulator comprising an antenna port for every antenna element connector and a number of test signal ports, and a signal evaluation device for every one of the test signal ports that is coupled to the respective test signal port and that in each case is configured to receive a downstream test signal from the channel emulator and to evaluate the received downstream test signal and/or to provide an upstream test signal to the channel emulator via the test signal port, wherein the channel emulator is configured to receive downstream signals emitted by the antenna elements at the antenna ports and to perform a channel emulation on the received downstream signals and to output on each test signal port a single respective downstream test signal, and/or wherein the channel emulator is configured to receive upstream test signals from the respective signal evaluation devices via the test signal ports and to perform a channel emulation on the received upstream test signals and to output on each antenna port a respective upstream signal.

20 Claims, 4 Drawing Sheets

(51) Int. Cl.
*H04B 17/12* (2015.01)
*H04B 17/21* (2015.01)
*H04B 17/391* (2015.01)
*H04W 24/06* (2009.01)

(56) References Cited

U.S. PATENT DOCUMENTS

| | | | |
|---|---|---|---|
| 2014/0242914 A1* | 8/2014 | Monroe | H04B 17/21 455/63.4 |
| 2015/0017928 A1* | 1/2015 | Griesing | H04B 17/0087 455/67.14 |
| 2016/0212641 A1* | 7/2016 | Kong | H04B 17/0087 |
| 2017/0373773 A1* | 12/2017 | Jing | H04B 17/102 |

* cited by examiner

ANTENNA TEST SYSTEM AND A METHOD FOR TESTING AN ANTENNA

TECHNICAL FIELD

The invention relates to an antenna test system and a method for testing an antenna.

BACKGROUND

Although applicable to any antenna system, the present invention will mainly be described in conjunction with active or so called massive MIMO antennas.

Today wireless communication networks are widely used for providing voice and data communication to users. Such wireless communication networks, like e.g. LTE based or so called 4G networks, usually comprise a core network and a so called radio access network or RAN. It is understood, that each of these interrelated networks may comprise a plurality of different elements, modules or units that together provide the required communication capabilities.

As part of the RAN so called eNodeBs or base stations provide the link between the operators network and the users mobile devices or user equipments (UEs). Usually the eNodeBs will comprise antennas that serve for transmitting outgoing signals to the UEs and for receiving incoming signals from the UEs. Up to now, most commonly passive or active antennas with fixed radiation patterns are used.

However, in modern 5G-Networks such conventional antennas may be replaced by massive MIMO antennas (antennas with a plurality of single antenna elements that may form and steer a plurality of beams at the same time). Such massive MIMO antennas usually require a single transceiver, e.g. a combination of a transmitter and a receiver, for every antenna element.

Since a massive MIMO or active antenna may comprise a plurality of transceivers, i.e. different signal paths for the single antenna elements, testing and qualifying such an antenna may be complex and difficult.

Conventional antennas and active antennas, which may be massive MIMO antennas, may be tested wired or wirelessly. When performing a wired test, the antennas may e.g. be tested by evaluating every antenna port separately. The difference of massive MIMO antennas to conventional remote radio heads is that those conventional remote radio heads have much fewer ports. In order to simplify testing of many ports required for massive MIMO, RF switches may be used to connect each of the RF ports to the measurement equipment sequentially. Wired testing has the advantage of a high dynamic range due to the high power received at the measurement equipment, which is important to evaluate, e.g., unwanted spectral emissions. It also allows identifying individual components that are mal-functioning and determining statistical distribution of RF transceiver performance. However, test setups are very complex and expensive because they operate on the RF signals, requiring costly components and huge efforts for calibration.

Wireless testing, also called over the air or OTA testing, may e.g. include measuring antenna radiation patterns in anechoic chambers. One drawback of the conventional setup for such measurements is that the distance to the device under test (DUT) must be large enough to perform the measurement in the far field. The far field distance for state of the art antennas can easily be 10 m or more and chambers of this size are hardly available or very expensive to rent or build. Such wireless measurement solutions are capable of characterizing the antenna with respect to the conventional metrics such as antenna gain, side lope levels, front-to-back ratio etc. They can however not be used to emulate the performance of the complete massive MIMO system in the more complex mobile environment. Also they cannot be used to evaluate the effects of UE interference and coupling (for realistic channels).

Accordingly, there is a need for allowing an improved and simplified testing of antennas.

SUMMARY OF THE INVENTION

The above stated problem is solved by the features of the independent claims. It is understood, that independent claims of a claim category may be formed in analogy to the dependent claims of another claim category.

Accordingly, it is provided:

An antenna test system for testing an antenna with a plurality of antenna elements, the antenna test system comprising an antenna element connector for every antenna element of the antenna, wherein the antenna element connectors are wiredly couplable to the respective antenna elements, a channel emulator comprising an antenna port for every antenna element connector and a number, i.e. one or more, of test signal ports, and a signal evaluation device for every one of the test signal ports that is coupled to the respective test signal port and that in each case is configured to receive a downstream test signal from the channel emulator and to evaluate the received downstream test signal or to provide an upstream test signal to the channel emulator via the test signal port, wherein the channel emulator is configured to receive downstream signals emitted by the antenna elements at the antenna ports and to perform a channel emulation on the received downstream signals and to output on each test signal port a single respective downstream test signal, and/or wherein the channel emulator is configured to receive upstream test signals from the respective signal evaluation devices via the test signal ports and to perform a channel emulation on the received upstream test signals and to output on each antenna port a respective upstream signal.

Further, it is provided:

A method for testing an antenna with a plurality of antenna elements, the method comprising generating an upstream signal for every one of the antenna elements of the antenna, and/or receiving a downstream signal from every one of the antenna elements of the antenna, and evaluating at least the downstream test signals, wherein generating comprises generating upstream test signals in a number of signal evaluation devices, and performing a channel emulation on the generated upstream test signals and providing to the antenna elements the upstream signals based on the channel emulation of the received upstream test signals, wherein receiving comprises receiving the downstream signals emitted by the antenna elements, and performing a channel emulation on the received downstream signals and providing respective downstream test signals based on the channel emulation of the received downstream signals for the step of evaluating.

The present invention is based on the finding that testing an active antenna, like e.g. a massive MIMO antenna, with a plurality of antenna elements may be a complex task. This is especially true for common test equipment that may only test single antenna elements at a time. Wireless test systems on the other hand may test all antenna elements with a single measurement. However, such systems may not evaluate signals of single antenna elements but only the resulting superimposed signal.

Massive MIMO antennas can be characterized like conventional beamforming antenna arrays, i.e. through radiation measurements in anechoic chambers. However, the performance of a massive MIMO system depends on both the applied scheduling and PHY algorithms. Thus, it can only be evaluated in combination with the lower and upper PHY baseband signal processing. Furthermore, the performance of massive MIMO heavily depends on the channel conditions, including fading in time, frequency and space. A major feature of massive MIMO is spatial precoding which can only be assessed when the signals of all ports are measured separately and instantaneously.

The present invention provides a system and a method that allows easily testing an active antenna with any number of antenna elements easily, e.g. massive MIMO antennas.

To this end the present invention provides a wired testing system, where the channel emulator may be connected via the antenna element connectors to the single antenna elements of the antenna to be tested, also called device under test or DUT. By connecting to the single antenna elements it is understood that the antenna element connectors may be coupled to the signal path between the respective antenna element and the respective transceiver. It is understood, that the DUT may comprise dedicated connectors for every one of the antenna elements that allow connecting the antenna element connectors to the DUT, i.e. to the signal lines that connect the antenna elements to the transceivers in the DUT. It is understood that the antenna element connectors may e.g. comprise cables and respective RF connectors. As alternative the antenna element connectors may also comprise a mechanical arrangement that allows automatically contacting the antenna elements or respective signal lines, e.g. in an automated production line. Such an arrangement may e.g. comprise motors and spring supported contacts that may push contact elements onto respective counterparts, e.g. contact pads, in the DUT. The channel emulator may e.g. be coupled to the antenna element connectors via dedicated cables.

Since the channel emulator may comprises one antenna port for every antenna element of the DUT, the channel emulator may comprise the same RF interface as the DUT itself. If for example the DUT has 64 antenna elements, the channel emulator may comprise a corresponding number of 64 antenna ports. The channel emulator is therefore connected to the RF interfaces of the DUT, i.e. the single antenna elements, via the antenna ports.

In the channel emulator a signal processing may be performed that implements a channel emulation. The term "channel emulation" in this case refers to a signal processing that adapts or modifies the downstream signals or the upstream signals according to a predetermined channel profile or channel model. It is understood that a specific channel profile or channel model may be applied to every single downstream test signal that is provided to a signal evaluation device. The channel profile or model will comprise information about the attenuations and phase shifts of the single downstream signals or upstream signals. Further, such a channel profile or model may comprise information about the superimposition of the single downstream signals for superimposition in a single downstream test signal. Of course such a channel profile or model may comprise the same information in upstream direction, i.e. information on the decomposition of a single upstream test signal into a plurality of upstream signals for the single antenna elements.

The channel profile or model may comprise a vector with a single element for every antenna element. Every element of the vector may define the above mentioned parameters for the respective downstream test signal. If more than a single signal evaluation unit is coupled to the channel emulator, different vectors may be provided for the single signal evaluation units. The combination of these vectors may also be called a channel matrix H.

In downstream direction, i.e. from the DUT to the signal evaluation units, the incoming downstream signals will be combined into a single downstream test signal for every signal evaluation unit using the corresponding vector or the channel matrix H. In upstream direction the single incoming upstream test signals from the signal evaluation units will be converted into dedicated upstream signals for every one of the antenna elements using the corresponding vector or the channel matrix H, accordingly.

The channel emulator therefore may provide a kind of interface between the DUT and the single signal evaluation devices. To this end the channel emulator may further comprise signal processing elements that allow the channel emulator to superimpose or combine the different downstream signals into the respective downstream test signals in the downstream case, and that allow the channel emulator to generate the plurality of upstream signals for the antenna elements from single upstream test signals in the upstream case.

With the present invention it is possible to effectively test active antennas with a plurality of antenna elements. Further, the signal evaluation devices may e.g. be simple UEs (User Equipment) with an interface to the channel emulator. Such UEs may e.g. be standard UEs with a modified interface that allows connecting the UEs to the channel emulator, i.e. the test signal ports.

With the present invention it is for example possible to evaluate the channel estimation of the DUT for different channel models or profiles. To this end, specific channel profiles or models may be configured in the channel emulator and the reaction of the antenna to the channel profiles or models may be analyzed in the signal evaluation units. Especially in TDD (Time Division Duplex) systems, it is possible to further analyze the channel aging processing of the DUT. "Channel aging" in this context refers to changes in the communication channel between a transmitting and a receiving period.

Evaluating in this context may for example refer to the signal evaluation device for example determining for the downlink test signal a signal level, a signal to noise ratio or any other characteristic value that may be useful or that are determined by UEs during normal operation in the wireless communication system.

Further embodiments of the present invention are subject of the further subclaims and of the following description, referring to the drawings.

In an embodiment, the channel emulator may comprise a beamforming processor that is coupled to the antenna ports and the test signal ports and that is configured to output the downstream test signals and/or to receive the upstream test signals via the test signal ports.

The beamforming processor of the channel emulator may receive the above mentioned channel matrix H. In contrast, the DUT will usually be provided with a beamforming vector, e.g. by a baseband processor of the respective communication system, that indicates to the DUT where to direct the single communication beams. It is understood, that the beamforming processor in the channel emulator may be the same as the beamforming processor in the DUT.

Instead of the beamforming matrix the respectively configured channel vector, for each signal evaluation unit, or the channel matrix, combined for all signal evaluation units, may be provided to the beamforming processor in the channel emulator. The beamforming processor may therefore perform the channel emulation using time-, frequency-, and spatial domain fading that is required for the channel emulation.

It is understood, that the beamforming processor in the channel emulator may perform the same mathematical operations as the beamforming processor in the respective DUT.

In another embodiment, the antenna test system may comprise a channel profile generator that is coupled to the beamforming processor and is configured to controllably provide a channel profile to the beamforming processor, i.e. a channel matrix H.

The channel profile or model may be static or dynamic. A static channel profile means that the channel matrix H will not change over time. In contrast, a dynamic channel profile means that the channel matrix H may change over time. The channel profile generator may e.g. comprise a memory with standardized fading models that may be selected. In addition or as alternative, the parameters of the channel may e.g. be changed constantly.

The invention also allows placing predefined channel model sequences in a memory, e.g. of the channel profile generator, and to replay those sequences during a test of a DUT. While the beamforming at the DUT will likely only be changed every codeword (TTI, e.g. 1 ms), the change in the channel emulator that is performed by the channel profile generator may be more rapid for modeling high mobility channels with fast time domain fading. As alternative to pre-stored predefined channel model sequences, the predefined channel model sequences may also be determined in real time programmatically.

In a further embodiment, the channel emulator may comprise a transceiver for every antenna port, wherein the transceivers may be connected between the beamforming processor and the respective antenna port.

The channel emulator may comprise the same or similar elements that an active antenna like the DUT may comprise. In an embodiment, the channel emulator may comprise the same arrangement that is provided in the DUT for communicating via RF signals. This means, that the channel emulator may be connected to the DUT in a mirrored fashion, where the transceivers of the channel emulator are coupled to the respective transceivers of the DUT and implement the RF interface.

In an embodiment, the channel emulator may even be based on or be the same type of antenna as the DUT. However, it is understood, that the antenna elements may be removed in the channel emulator. As explained above, the beamforming processor of the channel emulator may be fed with the respective channel matrix, instead of the beamforming matrix that is provided to the DUT.

Since two identical or almost identical devices may be coupled as the DUT and the channel emulator, for an FDD system, the frequency of the receiver and the transmitter may be swapped (as is the case in any FDD UE). However, usually massive MIMO systems are TDD systems, which does not require any (RF) hardware changes compared to the DUT, because only the RX/TX ON/OFF times are swapped.

In an embodiment, the test signal ports may comprise a digital interface configured to transmit the downstream test signals and the upstream test signals, especially in the form of time-domain IQ data streams or frequency domain IQ samples.

The signal evaluation units may be connected to the channel emulator through a digital interface. In this case, the signal evaluation units do not require a dedicated RF signal processing chain. Instead, the signal evaluation units only require a digital signal processing section for evaluating the signal received from the DUT and for providing signals to the DUT via the channel emulator.

In many cases UEs in the real application of the DUT may have more receiving layers than transmission layers. The number of layers in the signal evaluation units may be chosen accordingly. It may also be possible to use real UEs that are stripped of their RF signal processing section. The term "layer" in this context refers to a single kind of communication channel with its own data and beamforming specifications.

It is further understood, that the signal evaluation units may be implemented in one enclosure and multiple signal evaluation units may be connected through the same physical interface to the channel emulator using some form of multiplexing.

It is understood, that the signal evaluation units may implement those parts of the PHY (physical layer) which are not implemented in the channel emulator. The functions of the PHY that are provided by the channel emulator may range from bit-by-bit or symbol-by-symbol delivery, over providing the radio interface, including electromagnetic spectrum frequency allocation and specification of signal strength, analog bandwidth, etc., modulating outgoing signals, demodulating incoming signals, to error correction and the like. It is understood, that the channel emulator may perform all PHY functions as defined in the respective application or communication system that the antenna or DUT is intended for.

In a further embodiment, the channel emulator may comprise the signal evaluation devices, especially wherein the function of the signal evaluation devices may be provided as a computer executable program.

This means that the channel emulator may contain the functions of the signal evaluation units if it has the necessary processing resources. These resources may e.g. be provided by a processor or any other logic element, like e.g. a FPGA, DSP or the like. The functions of the signal evaluation units may therefore be provided as software, firmware or the like. In this case the signal evaluation units may be implemented at least in part as so called Software Defined Radios (SDRs).

In this case the channel emulator may provide an all in one testing solution for massive MIMO antenna arrays.

In another embodiment, the antenna test system may comprise a signal generation unit that is coupled to the antenna and is configured to provide the antenna with test signals and/or receive test signals from the antenna.

The signal generation unit may have the function of e.g. a Base Band Unit (BBU) as usually provided in eNodeBs or base stations of cellular communication systems, like e.g. LTE. This means that the DUT may be tested in the real application environment and with simulated but actual operational signals.

The signal generation unit may also receive signals from the antenna that are not beamformed. Such signals may e.g. be symbols that carry references symbols (such as the LTE sounding reference symbols) that may e.g. be used in a BBU to estimate the uplink channel and derive the downlink channel, e.g. based on channel reciprocity.

It is understood, that a real BBU may also be used instead of the signal generation unit in this case the signal generation unit may also be subject to the evaluation and may be qualified, e.g. regarding the generation of beamforming vectors in view of the predetermined channel models or profiels. This allows to further test the BBU for correct functionality.

In an embodiment, the antenna test system may comprise a synchronization evaluation unit that is coupled to or provided in the channel emulator and that is configured to determine calibration errors of the antenna.

Active or massive MIMO antennas will usually perform internal calibration or synchronization of the single signal chains that connect to the antenna elements. This calibration may be performed in many different ways and is not subject to the present invention. However, the present invention may be used to evaluate the internal calibration of the DUT by e.g. analyzing the synchronization of the signals that are emitted by the single antenna elements. Calibration or synchronization may refer to timing as well as phase and amplitude.

In the antenna test system it is for example possible to provide the DUT sequentially with different beamforming vectors. Since the theoretical resulting signals are known, the output at the single antenna elements may be compared to said theoretical resulting signals.

The present invention may further be used for testing of massive MIMO algorithms, like e.g. beamforming algorithms and channel estimation algorithms that fundamentally generate beam forming coefficients from channel estimates. With the present invention such algorithms may be tested against a functioning hardware. In this context the DUT may not only be the massive MIMO antenna, but the upper PHY and the BBU or vBBU (virtual Base Band Unit). The antenna test system in this arrangement may emulate a functioning massive MIMO antenna or e.g. provide a fully tested and qualified massive MIMO antenna instead of the DUT, and the channel emulator may be part of the system that may even generate real channels and allows connecting actual test UEs for full end-to-end testing.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
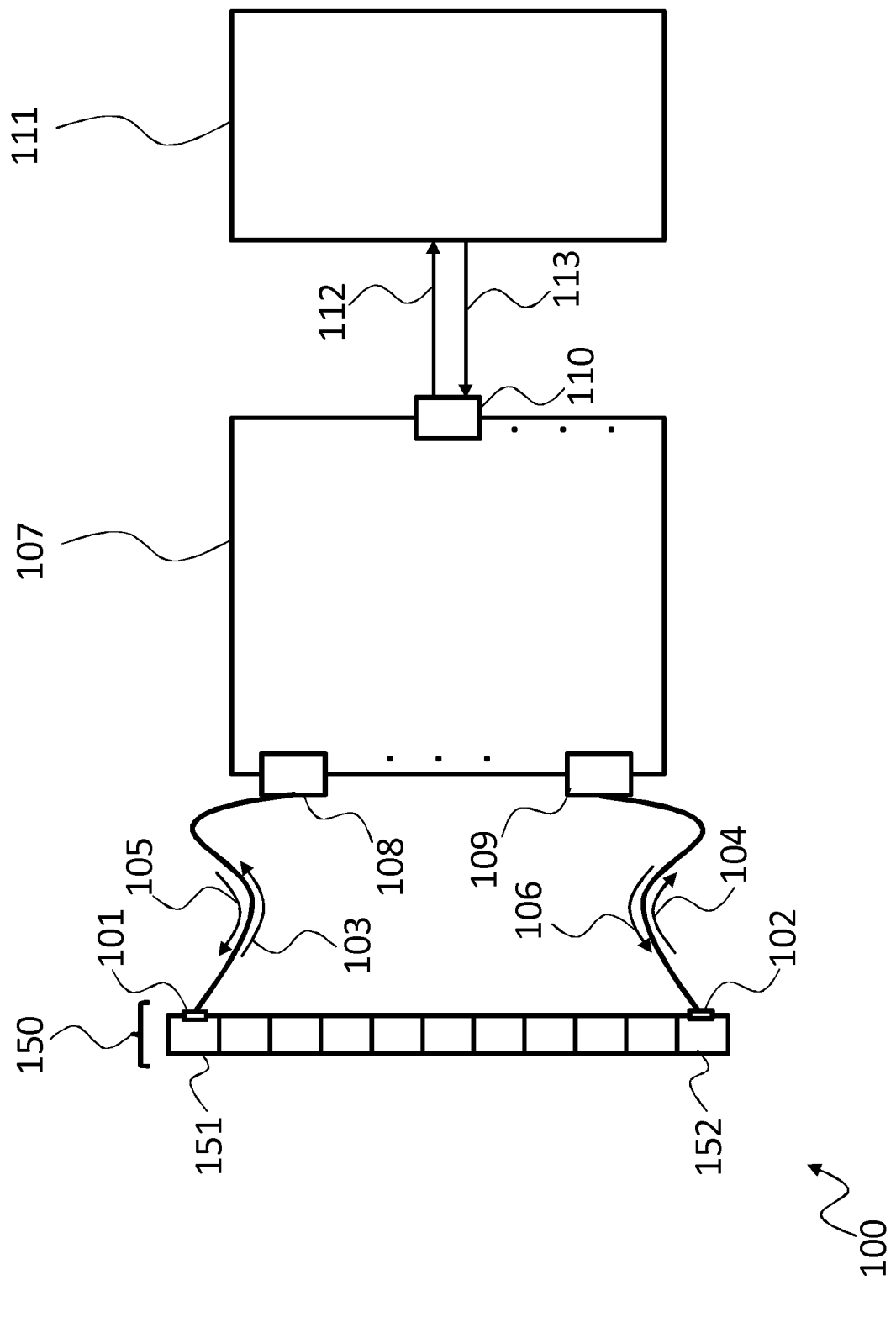
FIG. 1 shows a block diagram of an embodiment of an antenna test system according to the present invention.

FIG. 1 shows a block diagram of an antenna test system 100 for testing an antenna 150 with a plurality of antenna elements 151, 152. It is understood, that although only two antenna elements 151, 152 are provided with a reference sign for sake of clarity, any number of antenna elements, like e.g. 64 is possible. The antenna 150 may e.g. be a massive MIMO antenna 150.

The antenna test system 100 comprises two antenna element connectors 101, 102, one for every antenna element 151, 152 of the antenna 150. It is understood, that although only two antenna element connectors 101, 102 are shown, one antenna element connector may be provided for every antenna element. For example for testing a massive MIMO antenna with 64 antenna elements, 64 antenna element connectors may be provided.

The antenna element connectors 101, 102 are wiredly couplable to the respective antenna elements 151, 152. Wiredly in this context refers to a contact based coupling in contrast to e.g. a wireless or RF coupling. Therefore wiredly coupling does not necessarily require a wire but may also be performed e.g. with a contact element on a PCB or a contact arm or the like. In this case the antenna may e.g. comprise respective test pads or the like that allow the contact element to establish contact with the signal path between the respective one of the antenna elements 151, 152 and the respective transceiver. The coupling between the antenna element connectors 101, 102 and the antenna elements 151, 152 may however also be provided by a RF cable with respective connectors. It is understood, that the antenna 150 may comprise respective connector counterparts.

The antenna test system 100 further comprises channel emulator 107 that comprises an antenna port 108, 109 for every one of the antenna element connectors 101, 102. The channel emulator 107 further comprises a test signal port 110. The test signal port 110 is coupled to a signal evaluation device 111. It is understood, that more test signal ports and signal evaluation devices 111 are possible. In every case, one test signal port may be provided for every signal evaluation device.

For testing the antenna 150 the antenna test system 100 receives downstream signals 103, 104 from the antenna 150 via the antenna element connectors 101, 102 and the antenna ports 108, 109 and provides upstream signals 105, 106 to the antenna 150 via the antenna element connectors 101, 102 and the antenna ports 108, 109. The channel emulator 107 performs the respective channel emulation on the downstream signals 103, 104. The downstream signals 103, 104 are then provided as downstream test signals 112 to the signal evaluation device 111. In upstream direction, the channel emulator 107 receives upstream test signals 113 from the signal evaluation device 111 and performs the respective channel emulation and provides the resulting upstream signals 105, 106 to the antenna 150.

The downstream test signal 112 may be sent to the signal evaluation device 111 as digital signals, for example as time-domain IQ data streams or frequency domain IQ samples. The same applies to the upstream test signals 113 that may e.g. be sent from the signal evaluation device 111 to the channel emulator 107 as time-domain IQ data streams or frequency domain IQ samples.

The signal evaluation device 111 will then evaluate the downstream test signal 112 to determine, if the downstream test signal 112 is as expected, e.g. regarding signal levels, signal-to-noise ration and the like.

The term "channel" in a live environment represents the coupling of the antenna elements 151, 152 to the antenna of a UE. The channel emulation may therefore apply respective channel parameters to the downstream signals 103, 104 and the upstream test signals 113. The channel parameters may e.g. define an attenuation and a phase shift for every single signal. In downstream direction the single channel emulated downstream signals 103, 104 may then be additively combined to form the resulting downstream test signal 112. In upstream direction, the upstream test signals 113 may be duplicated for every upstream signal 105, 106 and every copy may be processed with the respective parameters to form the single upstream signals 105, 106.

It is understood, that the channel parameters may e.g. be provided as a vector. In case that more than one signal evaluation device 111 is present, a channel matrix may be provided that combines the channel vectors of the single signal evaluation devices 111.

The function that the channel emulator 107 performs is the same function that a beamforming unit performs in the active antenna 150, e.g. applying phase and amplitude corrections to the signals that are transmitted or received by the single antenna elements 151, 152. The difference is in the parameters that are provided to the beamforming unit and the parameters that are provided to the channel emulator 107. The beamforming unit will receive the respective beamforming parameters that result in a steered beam being formed by the overlay signal that results from the signals that are emitted by the single antenna elements 151, 152. In contrast, the channel emulator 107 will receive a respective channel vector or channel matrix with parameters regarding the channel.

Since the mathematical operations in the channel emulator 107 and the beamforming unit of the antenna 150 are the same, the beamforming unit of any antenna 150 may be used as channel emulator 107. It is therefore possible to use an antenna that is identical or equal to the antenna 150 as channel emulator 107. The channel emulator antenna and the antenna 150 may then be coupled to each other antenna-element-wise. This means that every antenna element of the channel emulator antenna may be coupled with one of the antenna elements 151, 152 of the antenna 150.

It is understood, that the channel vector or channel matrix that is provided to the channel emulator 107 may be static or dynamic, i.e. it may vary in time. A dynamic channel vector or channel matrix may e.g. be used to test the behavior of the antenna 150 against channel fading, i.e. a channel that changes over time.

It is especially possible to vary the channel vector or the channel matrix faster than it may change on the antenna side of the antenna 150. The antenna 150 or a baseband unit at the antenna 150 will usually change the beamforming e.g. every codeword, i.e. every 1 ms in a LTE system. Channel fading in high mobility channels may however lead to changes that happen faster than every 1 ms.

With the present invention it is therefore not only possible to verify if the antenna 150 provides the downstream signals 103, 104 and reacts to upstream signals 105, 106 as expected. It is further possible to evaluate if the antenna 150 copes with fast fading channels. It is further possible to provide multiple signal evaluation devices 111 and test the antenna 150 with multiple static or dynamic channel models at the same time.

Although not shown, it is understood that the antenna 150 may comprise further signal processing elements, like e.g. a beamformer and the transceivers for the antenna elements 151, 152. Further, a baseband unit (BBU) may also form part of the DUT or antenna 150.

Figure 2:
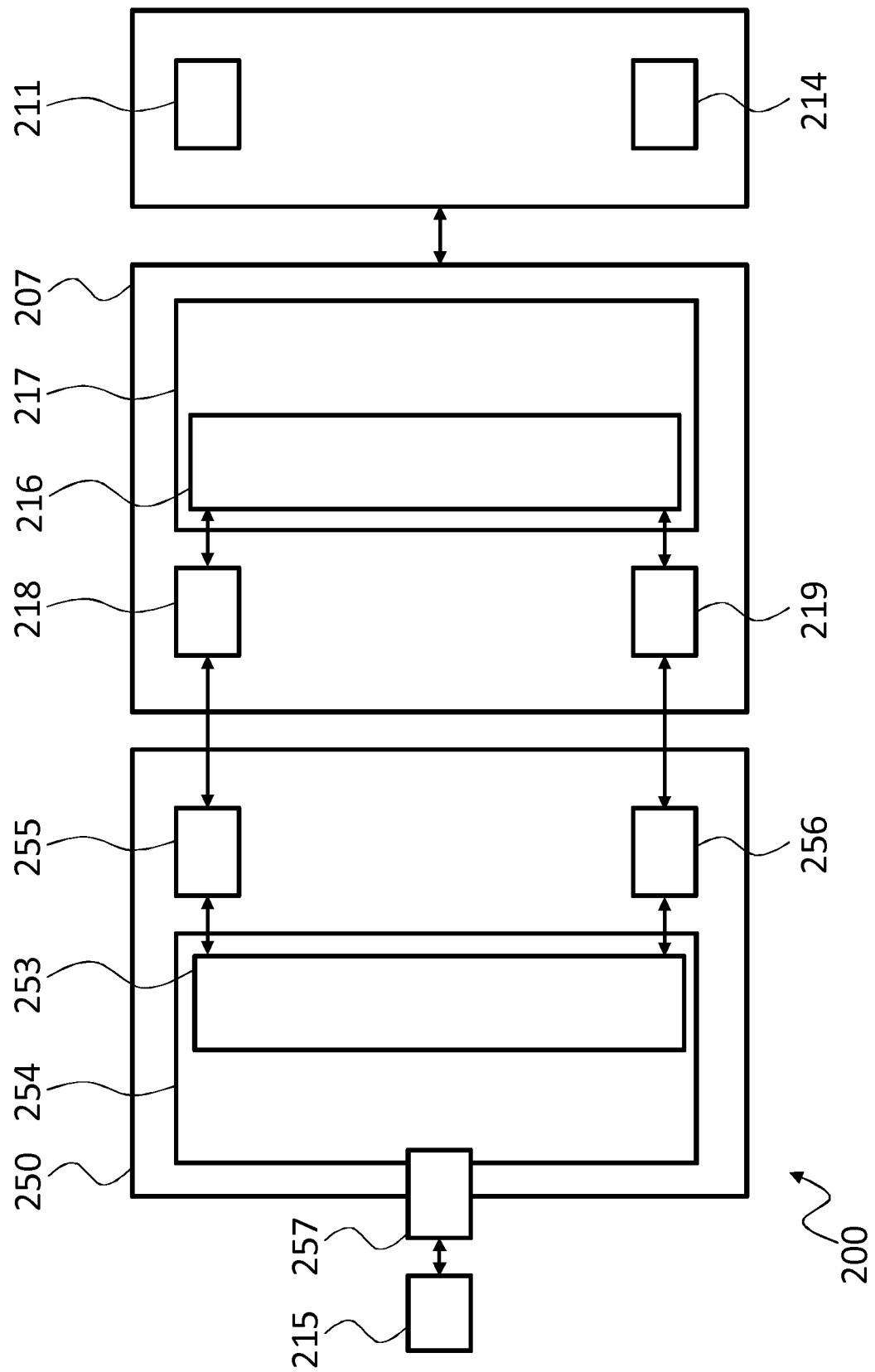
FIG. 2 shows another block diagram of an embodiment of an antenna test system according to the present invention.

FIG. 2 shows another block diagram of an antenna test system 200. The antenna test system 200 comprises a signal generation unit 215 that is coupled to the antenna 250. The transceivers 255, 256 of the antenna 250 are coupled to transceivers 218, 219 in the channel emulator 207 and the channel emulator 207 is coupled to two signal evaluation units 211, 214. It is understood, that the two transceivers 255, 256 and the two transceivers 218, 219 are just exemplarily shown and that any other number of transceivers is possible. For example for a massive MIMO antenna with 64 antenna elements 64 transceivers may be provided in the antenna 250 and the channel emulator 207.

The antenna 250 comprises a beamforming processor 253 that is arranged in an interface subunit 254. In the antenna 250 the interface subunit 254 serves for receiving for example IQ data streams and converting the IQ data streams into data streams for the transceivers 255, 256. It is understood, that the interface subunit 254 is an optional element and that the beamforming processor 253 may also be provided separately or in other elements of the antenna 250. It is further understood, that the transceivers 255, 256 may not only comprise transceivers with an IQ input and a RF output. The transceivers 255, 256 may further be comprised in a kind of radio subunit that each may serve more than one single antenna element.

The antenna 250 is coupled to the signal generation unit 215 via an upper PHY interface that implements at least some of the upper physical layer functions. It is understood, that this upper PHY interface is just exemplarily shown at this position and that any other function partitioning between the antenna 250 and the signal generation unit 215 is possible.

The massive MIMO antenna 250 therefore implements parts of the PHY and the RF interface. Depending on the functional split used, some upper PHY functions such as (de-)modulation, coding, etc. are either implemented in the signal generation unit 215 or the antenna 250, e.g. in the pre-beamforming part. Which algorithms and where these algorithms are implemented is not relevant at this point. In fact, if some of the algorithms are implemented in the signal generation unit 215, an operational signal generation unit 215 like e.g. a BaseBandUnit (BBU) may also be tested with the antenna 250. The interface between the signal generation unit 215 and the antenna 250 may e.g. be a digital interface, which may be a CPRI interface or any of the e.g. 3GPP or XRAN interfaces specified for massive MIMO antennas.

The beamforming processor 253 is usually implemented in the frequency domain. For each of P resource blocks (e.g. LTE pysical resource block), the beamforming processor 253 performs a Mb(μl)×N or a Mb(dl)×N matrix multiplication, where Mb(dl) is the number of layers in the downlink direction and Mb(μl) is the number of layers in the uplink direction and N is the number of antenna ports (usually the same for uplink and downlink).

The channel emulator 207 comprises an interface subunit 217 that comprises a beamforming processor 216 and that is coupled to the transceivers 218, 219. It can be seen, that the arrangement of the channel emulator 207 is the same as for the antenna 250 and that the channel emulator 207 is coupled to the antenna 250 in a mirrored fashion. The difference may be that a fully qualified and tested antenna is provided as the channel emulator 207 and that the beamforming processor 216 is provided with a channel vector or channel matrix instead of a beamforming vector.

Although not explicitly shown in FIGS. 1 and 2, it is understood, that the antenna test system 100, 200 may further comprise a channel profile generator that is coupled to the beamforming processor 216 and controllably provides a dynamic or static channel profile to the beamforming processor 216. Further, a synchronization evaluation unit may be coupled to the channel emulator 207 and may determine calibration errors of the antenna 250. This function may also be implemented in the signal evaluation units 211, 214.

Figure 3:
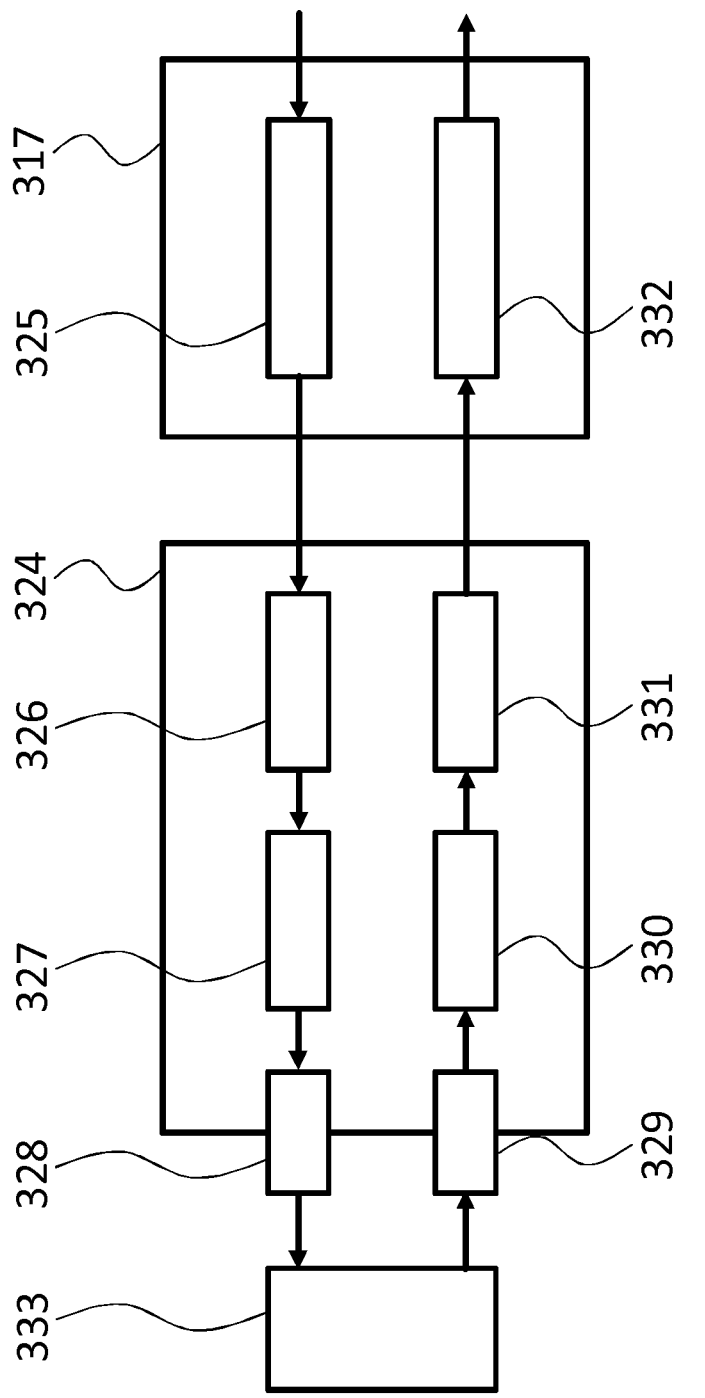
FIG. 3 shows a block diagram of an embodiment of a channel emulator according to the present invention.

FIG. 3 shows a block diagram of a channel emulator 307. The channel emulator 307 comprises an interface subunit 317 that is coupled to a radio subunit 324. The radio subunit 324 is coupled to a RF frontend 333.

The radio subunit 324 comprises the downlink processor, here shown as a downlink beamforming 325 and an uplink beamforming 332. The radio subunit 324 in contrast comprises the functions for transforming the beamformed signals into outgoing RF signals or for transforming the incoming RF signals into digital signal for applying the beamforming.

To this end, the radio subunit 324 comprises in downlink direction starting from the interface subunit 317 a Fourier transform module 326 that is coupled to a calibration module 327 that is coupled to a transmitter 328. The transmitter 328 is coupled to the RF frontend 333. In uplink direction the radio subunit 324 comprises starting at the RF frontend 333 a receiver 329 that is coupled to a calibration unit 330 that is coupled to an inverse Fourier transform unit 331.

The signal evaluation devices may e.g. be connected to the channel emulator 307 through a digital interface, which may transfer frequency domain samples. The signal evaluation devices may have more receive layers than transmit layers. The number of layers Mu(dl) and Mu(μl) are chosen accordingly. Note that Mu(dl) is the receive direction of the signal evaluation devices. The signal evaluation devices may be implemented in one enclosure and multiple signal evaluation devices may be connected through the same physical interface using a form of multiplexing. The signal evaluation devices may implement those parts of the PHY, which are not implemented in the channel emulator 307. As alternative the channel emulator 307 may also contain the functions of the signal evaluation devices, e.g. as software defined radio modules, if it has the necessary processing resources.

With the antenna test system 100, 200 of the present invention it is not only possible to test antennas 150, 250 and when required the base band unit (BBU) that is coupled to the antenna 150, 250. It is also possible to perform an in-depth evaluation of massive MIMO algorithms, like e.g. beamforming algorithms, channel prediction algorithms and the like, that are used in the respective antenna. Such algorithms may e.g. generate beam forming coefficients from channel estimates. The present invention now allows testing such algorithms against a fully functional hardware. In massive MIMO systems especially the channel estimation algorithms in uplink direction and the optimization of the downlink beamformer based on the channel estimation are important to test and optimize. This is especially true for TDD systems.

In this context the DUT may not only be the massive MIMO antenna, but also the upper PHY and the vBBU or even only the upper PHY and the vBBU. The term "vBBU" in this context refers to a BBU that is virtualized e.g. as software component. The antenna test system 100, 200 may emulate a functioning massive MIMO antenna and the channel emulator as part of the antenna test system 100, 200 may generate real channels and allows connecting actual test UEs for full end-to-end testing.

For sake of clarity in the following description of the method based FIG. 4 the reference signs used above in the description of apparatus based FIGS. 1-3 will be maintained.

Figure 4:
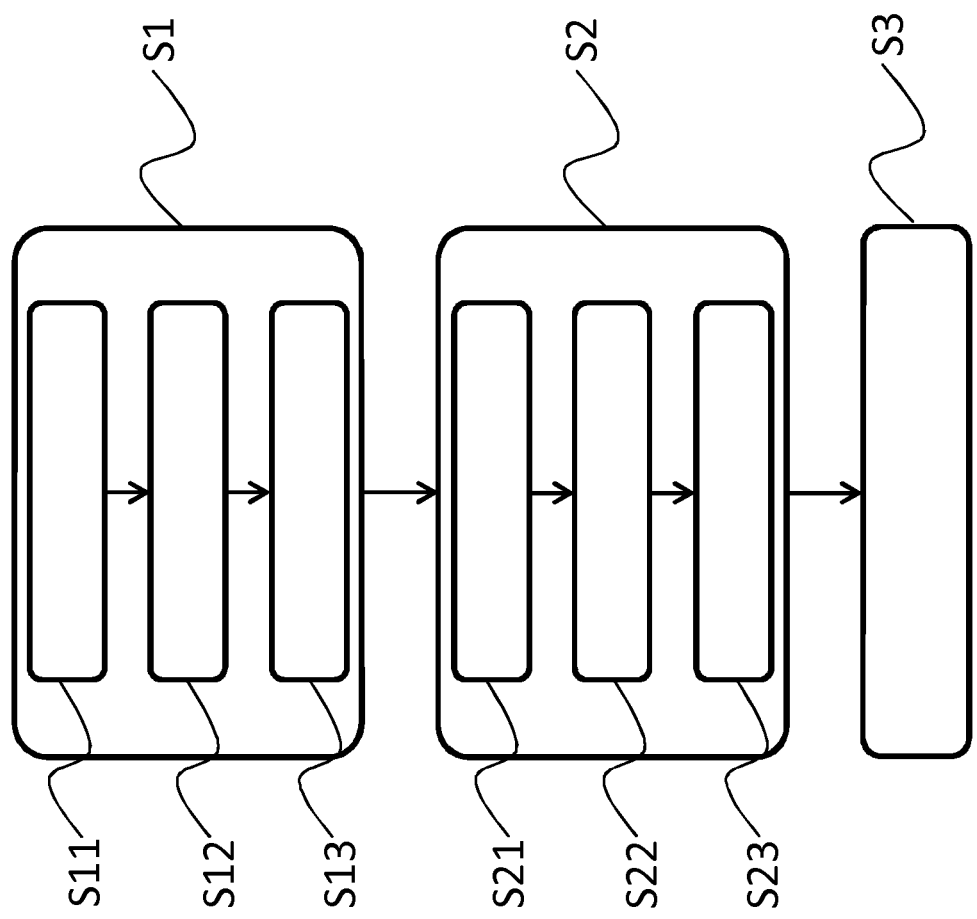
FIG. 4 shows a flow diagram of an embodiment of method according to the present invention.

FIG. 4 shows a flow diagram of an embodiment of method for testing an antenna 150 with a plurality of antenna elements 151, 152.

The method comprises generating S1 an upstream signal 105, 106 for every one of the antenna elements 151, 152 of the antenna 150, and/or receiving S2 a downstream signal 103, 104 from every one of the antenna elements 151, 152 of the antenna 150, and evaluating S3 at least the downstream test signals 112.

Generating S1 comprises generating S11 upstream test signals 113 in a number of signal evaluation devices 111, 211, 214, and performing S12 a channel emulation on the generated upstream test signals 113 and providing S13 to the antenna elements 151, 152 the upstream signals 105, 106 based on the channel emulation of the received upstream test signals 113. Receiving S2 comprises receiving S21 the downstream signals 103, 104 emitted by the antenna elements 151, 152, and performing S22 a channel emulation on the received downstream signals 103, 104 and providing S23 respective downstream test signals 112 based on the channel emulation of the received downstream signals 103, 104 for the step of evaluating S3.

To simplify the channel emulation, performing a channel emulation may comprise performing a beam forming on the downstream test signals 112 and/or the upstream test signals 113, wherein beam forming is especially performed based on a predefined static or dynamic channel profile. This is possible, since the mathematical operations for performing a beamforming and for performing a channel emulation are the same. Instead of beamforming vectors a channel vector may therefore be provided as a basis for performing the channel emulation.

Providing S13 and receiving S21 may be performed with a transceiver 218, 219 for every antenna port 108, 109. This means that the antenna 150 is contacted via the RF interface for performing the test.

The downstream test signals 112 and/or the upstream test signals 113 may in contrast be transmitted via a digital interface. Such an interface may transmit the downstream test signals 112 and the upstream test signals 113 in the form of time-domain IQ data streams or frequency domain IQ samples.

Performing a channel emulation and evaluating S3 the downstream test signals 112 may further be performed in a single device. The function of evaluating S3 the downstream test signals 112 may for example be provided by a computer executable program. This means that a kind of software defined radio may be provided.

The method may further comprise providing the antenna 150 with test signals and/or receiving test signals from the antenna 150 via a wired interface. Such test signals may comprise IQ-signals and may be provided and received via a CPRI interface. The test signals may be input signals to or output signals from the antenna 150 on the network side of the antenna 150, in contrast to the RF side of the antenna 150.

The method may also comprise determining calibration errors of the antenna 150 based on the received downstream test signals 112.

Estimating the calibration error requires that the test system (channel emulator) is calibrated as well, such a calibrated channel emulator may be called a golden device. Further, the wiring between DUT and test system may also calibrated. In this case, the phase and amplitude differences measured at different ports equal the phase and amplitude differences of the DUT. The advantage of the given setup with the channel emulator is that the phase and amplitude can be measured more quickly in shorter time because no switching is required between the single ports of the DUT.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

The present invention provides an antenna test system for testing an antenna with a plurality of antenna elements, the antenna test system comprising an antenna element connector for every antenna element of the antenna, wherein the antenna elements are wiredly couplable to the respective antenna elements, a channel emulator comprising an antenna port for every antenna element connector and a number of test signal ports, and a signal evaluation device for every one of the test signal ports that is coupled to the respective test signal port and that in each case is configured to receive a downstream test signal from the channel emulator or to provide an upstream test signal to the channel emulator via the test signal port, wherein the channel emulator is configured to receive downstream signals emitted by the antenna elements at the antenna ports and to perform a channel emulation on the received downstream signals and to output on each test signal port a single respective downstream test signal, and/or wherein the channel emulator is configured to receive upstream test signals from the respective signal evaluation devices via the test signal ports and to perform a channel emulation on the received upstream test signals and to output on each antenna port a respective upstream signal. Further, the present invention provides a respective method.

LIST OF REFERENCE SIGNS 100, 200 antenna test system
101, 102 antenna element connector
103, 104 downstream signal
105, 106 upstream signal
107, 207, 307 channel emulator
108, 109 antenna port
110 test signal port
111, 211, 214 signal evaluation device
112 downstream test signal
113 upstream test signal
215 signal generation unit
216 beamforming processor
217, 317 interface subunit
218, 219 transceiver
324 radio subunit
325 downlink beamforming
326 Fourier transform
327 calibration
328 transmitter
329 receiver
330 calibration
331 inverse Fourier transform
332 uplink beamforming
333 RF frontend
150, 250 antenna
151, 152 antenna element
253 beamforming processor
254 interface subunit
255, 256 transceiver
257 upper physical layer
S1, S2, S3 method steps
S11, S12, S13 method steps
S21, S22, S23 method steps

The invention claimed is:

1. An antenna test system for wiredly testing an antenna with a plurality of antenna elements, the antenna test system comprising:
   an antenna element connector for every antenna element of the antenna, wherein the antenna element connectors are wiredly couplable to the respective antenna elements,
   a channel emulator comprising an antenna port for every antenna element connector and a number of test signal ports, and
   a signal evaluation device for every one of the test signal ports that is coupled to the respective test signal port and that in each case is configured to receive a downstream test signal from the channel emulator and to evaluate the received downstream test signal and/or to provide an upstream test signal to the channel emulator via the test signal port,
   wherein a signal generation unit is wiredly couplable to the antenna and is configured to provide the antenna with test signals, and the antenna elements are configured to emit downstream signals based on the test signals,
   wherein the channel emulator is configured to receive the downstream signals emitted by the antenna elements at the antenna ports and to perform a channel emulation on the received downstream signals and to output on each test signal port a single respective downstream test signal, and/or wherein the channel emulator is configured to receive upstream test signals from the respective signal evaluation devices via the test signal ports and to perform a channel emulation on the received upstream test signals and to output on each antenna port a respective upstream signal.

2. The antenna test system according to claim 1, wherein the channel emulator comprises a beamforming processor (216) that is coupled to the antenna ports and the test signal ports and that is configured to output the downstream test signals and/or to receive the upstream test signals via the test signal ports.

3. The antenna test system according to claim 2, comprising a channel profile generator that is coupled to the beamforming processor and is configured to controllably provide a channel profile to the beamforming processor.

4. The antenna test system according to claim 2, wherein the channel emulator comprises a transceiver for every antenna port, wherein the transceivers are connected between the beamforming processor and the respective antenna port.

5. The antenna test system according to claim 1, wherein the test signal ports comprise a digital interface configured to transmit the downstream test signals and the upstream test signals, especially in the form of time-domain IQ data streams or frequency domain IQ samples.

6. The antenna test system according to claim 1, wherein the channel emulator comprises the signal evaluation devices, especially wherein the function of the signal evaluation devices is provided as a computer executable program.

7. The antenna test system according to claim 1, further comprising the signal generation unit, wherein the signal generation unit is further configured to receive test signals from the antenna.

8. The antenna test system according to claim 1, comprising a synchronization evaluation unit that is coupled to the channel emulator and that is configured to determine calibration errors of the antenna.

9. The antenna test system according to claim 3, wherein the channel emulator comprises a transceiver for every antenna port, wherein the transceivers are connected between the beamforming processor and the respective antenna port.

10. The antenna test system according to claim 7, comprising a synchronization evaluation unit that is coupled to the channel emulator and that is configured to determine calibration errors of the antenna.

11. A method for wiredly testing an antenna with a plurality of antenna elements, the method comprising:
   generating an upstream signal for every one of the antenna elements of the antenna, and/or receiving a downstream signal from every one of the antenna elements of the antenna, and
   evaluating at least the downstream test signals;
   wherein generating comprises generating upstream test signals in a number of signal evaluation devices, and performing a channel emulation on the generated upstream test signals and providing to the antenna elements the upstream signals based on the channel emulation of the received upstream test signals;
   wherein a signal generation unit is wiredly couplable to the antenna and is configured to provide the antenna with test signals, and the antenna elements are configured to emit the downstream signals based on the test signals,
   wherein receiving comprises receiving the downstream signals emitted by the antenna elements, and performing a channel emulation on the received downstream signals and providing respective downstream test signals based on the channel emulation of the received downstream signals for the step of evaluating.

12. The method according to claim 11, wherein performing a channel emulation comprises performing a beam forming on the downstream test signals and/or the upstream test signals, wherein beam forming is especially performed based on a predefined static or dynamic channel profile.

13. The method according to claim 11, wherein providing and receiving is performed with a transceiver for every one of the antenna elements via RF signals.

14. The method according to claim 11, wherein the downstream test signals and/or the upstream test signals are transmitted via a digital interface that especially transmits the downstream test signals and the upstream test signals in the form of time-domain IQ data streams or frequency domain IQ samples.

15. The method according to claim 11, wherein performing a channel emulation and evaluating the downstream test signals is performed in a single device, especially wherein the function of evaluating the downstream test signals is provided by a computer executable program.

16. The method according to claim 11, comprising providing the antenna with test signals and/or receiving test signals from the antenna via a wired interface, especially wherein the test signals comprise IQ-signals, especially wherein the test signals are provided and/or received via a CPRI interface.

17. The method according to claim 11, comprising determining calibration errors of the antenna based on the received downstream test signals.

18. The method according to claim 14, wherein performing a channel emulation and evaluating the downstream test signals is performed in a single device, especially wherein the function of evaluating the downstream test signals is provided by a computer executable program.

19. The method according to claim 18, comprising providing the antenna with test signals and/or receiving test signals from the antenna via a wired interface, especially wherein the test signals comprise IQ-signals, especially wherein the test signals are provided and/or received via a CPRI interface.

20. The method according to claim 19, comprising determining calibration errors of the antenna based on the received downstream test signals.

\* \* \* \* \*